United States Patent [19]

Koppe et al.

[11] Patent Number: 4,518,927
[45] Date of Patent: May 21, 1985

[54] SIGNAL PROCESSING SYSTEM COMPRISING A SIGNAL SOURCE, A SIGNAL PROCESSING UNIT AND CONNECTING CABLES

[75] Inventors: Rudolf P. Koppe; Hendrik Blom, both of Breda, Netherlands

[73] Assignee: U.S. Philips Corporation, New York, N.Y.

[21] Appl. No.: 507,201

[22] Filed: Jun. 23, 1983

[30] Foreign Application Priority Data

Jun. 24, 1982 [NL] Netherlands ............... 8202571

[51] Int. Cl.³ .............................................. H03G 3/30
[52] U.S. Cl. ................................................ 330/284
[58] Field of Search ............... 330/278, 279, 284, 285; 358/185

[56] References Cited

FOREIGN PATENT DOCUMENTS 2469829 5/1981 France ................................ 330/278

Primary Examiner—James B. Mullins
Assistant Examiner—G. Wan
Attorney, Agent, or Firm—Thomas A. Briody; William J. Streeter

[57] ABSTRACT

A signal processing system comprising a signal source (CAM), a signal processing unit (CPU) and connecting cables (CC1–CC5) having different lengths. A series circuit comprising a switchable signal attenuator (ATT), a low-noise, non-controlled signal amplifier (AMP2) and a AGC-signal amplifier (AMP1) is present to compensate for the variable cable losses. A change-over input (ST) of the signal attenuator (ATT) is coupled to a change-over circuit (ATS) which has a locking input (LT) and a measuring signal input (DT). The measuring signal input (TD) is coupled directly to a signal detection circuit (DET). A second output of the signal detection circuit is coupled to the locking input (LT), through a time signal generator (TSG). After a time delay of several dozen seconds, locking is effected, and the signal attenuator (ATT) can no longer switch-over during the normal signal processing operation and impermissible sudden signal amplitude changes are prevented.

5 Claims, 3 Drawing Figures

SIGNAL PROCESSING SYSTEM COMPRISING A SIGNAL SOURCE, A SIGNAL PROCESSING UNIT AND CONNECTING CABLES

BACKGROUND OF THE INVENTION

Field of the Invention

The invention relates to a signal processing system comprising a signal source, a signal processing unit and a connecting cable connectable between the source and the unit. The connecting cable may be selected from a plurality of connecting cables having different lengths with each having a variable cable loss which depends on the cable construction. The signal processing unit comprises a signal amplifier having automatic gain control, a low noise signal amplifier without automatic gain control and a switchable signal attenuator arranged in series. The signal attenuator has a change-over input coupled to a change-over circuit. The change-over circuit has a measuring signal input that is coupled to a signal detection circuit. An input of the signal detection circuit is coupled to a signal output for supplying a signal received from the connected cable. The supplied signal originating from the signal source has a substantially constant nominal amplitude.

Such a signal processing system is disclosed in U.S. Pat. No. 4,148,069. The signal source is a television camera connecting by a cable having a variable, optional length to a remote camera signal processing unit which may operate as a camera control unit. The processing unit applies control signals to the camera through the cables. The system may operate with time or frequency-division multiplex transmission. The cable loss or the cable attenuation of a signal to be transmitted of a predetermined frequency band is predominantly determined by the cable construction, such as the length of the cable and the diameter of the cable core or cable cores, depending on the chosen type, such as a coaxial or a triaxial cable. The cable loss varies as a function of the temperature variation at the cable. With the aid of the signal amplifier with automatic gain control, the influence of the variable cable loss can be compensated for. Therefore, the processing unit output signal has a substantially constant nominal amplitude, independant of the type of cable. In practice, it has been found that a cable loss variation from 0 to 52 dB may occur with a signal to be transmitted with a frequency of 45 MHz. As an example, a triaxial cable having a length between 0 and 2 kms and a diameter of 14 mm is convenient.

The use in the system of a signal amplifier having an automatic gain control between 0 and, for example, 52 dB over a signal frequency band from, for example, 5 to 50 MHz, is not attractive because, without special measures, the signal-to-noise ratio will be impermissibly low.

For that purpose the above-mentioned U.S. patent proposes to replace the single signal amplifier having the automatic gain control for the entire range of the cable loss by a combination of a signal amplifier having an automatic gain control over a smaller range, a signal-to-noise ratio which is consequently simpler to realize, and a switchable signal attenuator.

In practice it has been found that during television camera signal processing sudden amplitude changes may be produced. On display of the camera signal these amplitude changes may become visible in an annoying, impermissible way.

SUMMARY OF THE INVENTION

The invention has for its object a system in which sudden signal amplitude changes do not occur. A system according to the invention includes a change-over circuit with a locking input coupled to a time signal generator. The time signal generator has a measuring signal input coupled to a signal detection circuit. A time delay for locking the signal attenuator is present in the time signal generator.

This provides a temporarily switchable signal attenuator, which is locked some time after the cable connection between the source and the unit has been effected. Thus there is a waiting period before normal signal processing with the signal attenuator in the locked state is started. The locking prevents, impermissible sudden amplitude changes from occurring during the normal signal processing operation.

A waiting period after a cable connection has been effected occurs in an embodiment of a system where time delay operative for locking the signal attenuator, present in the time signal generator, has a duration of several dozen seconds.

The locking operation provides the possibility of a signal attenuator which during change-over results in large signal amplitude changes, the signal amplifiers operating with optimally adjusted gain factors.

An embodiment of a signal processing system in accordance with the invention provides a switchable signal attenuator having a plurality of n=2, 3, 4 etc. positions, a control range for an signal amplifier having the automatic gain control extending from zero to a value of at least $1/n$ C dB, where C dB is the maximum possible cable loss. The gain factor of the low-noise signal amplifier is not greater than the value of $(n-1)/n$ C dB and the switchable signal attenuator has n attenuation factors which in a series are not greater than the values of $(n-1)/n$ C dB, $(n-2)/n$ C dB, $(n-3)/n$ C dB inclusive. The last attenuation factor is substantially equal to zero.

DESCRIPTION OF THE FIGURES

The invention will now be further described by way of example with reference to the accompanying drawings, in which.

DESCRIPTION OF THE PREFERRED EMBODIMENT

Figure 1:
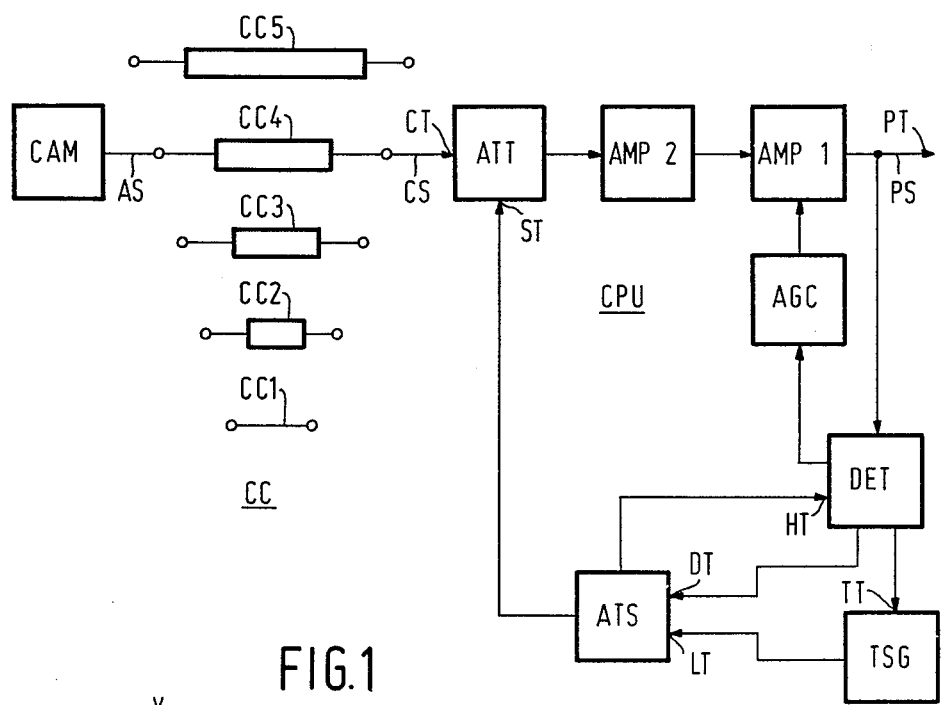
FIG. 1 illustrates by means of a block diagram an embodiment of a signal processing system in accordance with the invention.

The embodiment of a signal processing system in accordance with the invention, shown in FIG. 1 comprises a signal source CAM, a signal processing unit CPU and a cable system CC comprised of connecting cables CC1 to CC5, inclusive, having different lengths. The cables CC1 to CC5, inclusive may, for example, be in the form of coaxial or triaxial cables of different diameters. The cable CC5 may have a length of approximately 2 kms. and a diameter of 14 mm. The cable CC1 may have a minimal length and diameter. The choice as to which cable from the cable system CC will be used is determined by the distance between the signal source CAM and the unit CPU. The signal source CAM is, for example, a television camera for black-white or color television. Independent of its construction, let it be assumed that the source CAM produces a signal AS. The signal AS may be present in a frequency-division multiplex system for which the camera CAM and the unit CPU may be provided with hybrid and filter circuits. By way of example, let it be assumed that the signal AS is a video signal-modulated carrier having a carrier frequency of 45 MHz.

In FIG. 1 it is shown that the signal AS is transferred through the cable CC4 to the unit CPU and is received there as a signal CS. The cable CC4 has a cable loss or cable attenuation as a result of which the amplitude of the signal CS is attenuated relative to the signal AS. This attenuation is counteracted in the unit CPU so that at a signal output PT a signal PS occurs which has a substantially constant amplitude, independent of the variable cable loss which depends on the choice of cable in the cable system CC and on the cable temperature variation. For this purpose the output PT is coupled to an output of a signal amplifier AMP 1, which has an automatic gain control. A control input of the amplifier AMP1 is coupled to the output PT through a control circuit AGC and a signal detection circuit DET. The automatic gain control AGC can be effected in a customary manner, a keyed-mode control effected during line or field blanking periods being possible.

A signal input of the amplifier AMP1 is connected to an output of a non-controlled, low-noise signal amplifier AMP2. The input of low noise amplifier AMP2 is connected to an output of a switchable signal attenuator ATT. The low-noise signal amplifier AMP2 has, for example, a noise level of the order of 2 dB $\mu$V for the desired bandwidth. The switchable signal attenuator ATT has a change-over input ST and a signal input CT to which the signal CS is applied. The change-over input ST is coupled to an output of a change-over circuit ATS. The change-over circuit ATS has a measuring signal input DT and a locking input LT. The measuring signal input DT of the change-over circuit ATS is connected to an output of the detection circuit DET, the locking input LT being coupled to an output of a time signal generator TSG. The time signal generator TSG has a measuring signal input TT which is coupled to an output of the detection circuit DET. The detection circuit DET has a control input HT, which is coupled to an output of the change-over circuit ATS. Through input HT a hysteresis effect will be obtained, in a manner to be described, when the switchable signal attenuator ATT is changed-over. In the time signal generator TSG there is a time delay between the measurement at the measuring signal input TT of a given signal level in the output signal of the detection circuit DET and the supply of a locking signal to the locking input LT of the change-over circuit ATS. By way of example a time delay of several dozen seconds is mentioned. This time delay corresponds with a waiting period which occurs, after the signal processing system has been made operative, before the normal signal processing operation may be started.

Figure 2:
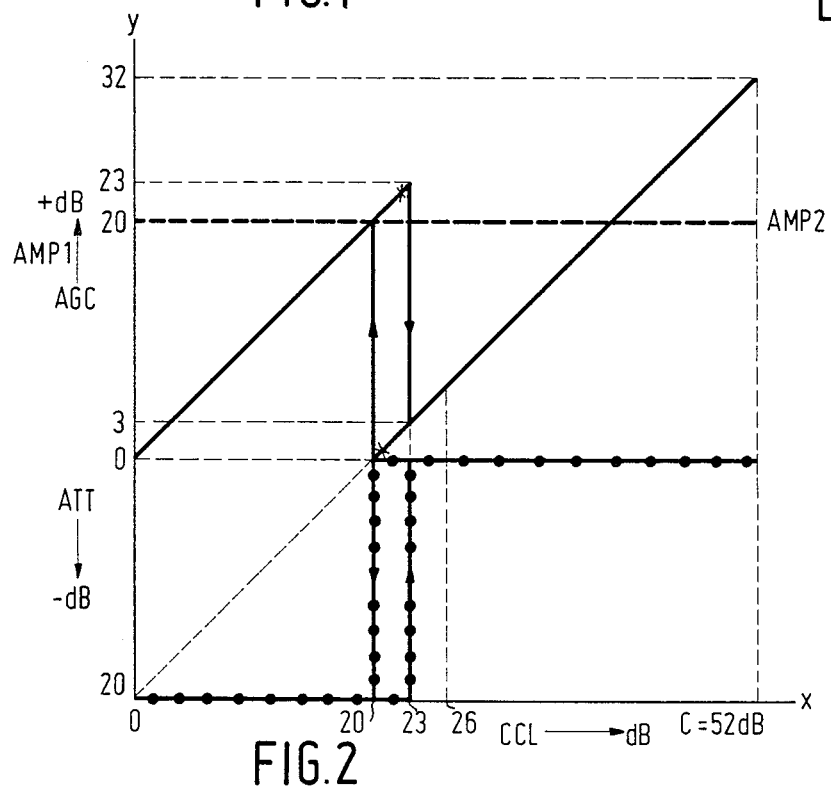
FIG. 2 shows graphs illustrating possible cable connections, gain and attenuation factors present in the system shown in FIG. 1.

To explain the operation of the processing system of FIG. 1 use is made of the graphs shown in FIG. 2. In FIG. 2 two axes X and Y, which are perpendicular to each other define a coordinate system. A cable loss CCL is plotted from 0 dB to a maximum value of for example, C=52 dB along the X-axis. The value of approximately 0 dB and 52 dB, respectively occurs at, for example, the connection in FIG. 1 of the connecting cable CC1 and CC5, respectively. A control range ACG of the signal amplifier AMP1 is plotted from 0 dB to 32 dB, along the Y-axis also plotted is an attenuation factor ATT of the signal attenuator ATT of FIG. 1 in −dB, more specifically with two switchable values of 0 dB and 20 dB. A thick dashed line AMP 2 in FIG. 2 designates the 20 dB gain factor of the non-controlled signal amplifier AMP2 of FIG. 1. The graph for the AGC control is shown by means of thick solid lines, the graph for the signal attenuator ATT being shown by means of thick solid lines and dots.

Let it be assumed that prior to making the signal processing system of FIG. 1 operative, that is to say the signal source CAM being operative, the connecting cable CC4 is connected. Alternatively, should the connecting cable CC4 already be connected, the source CAM is switched on. The attenuation factor ATT of FIG. 2 is equal to 0 dB and the controlled gain factor of the signal amplifier AMP1 is at its maximum (32 dB). From the moment the system is made operative, the detection circuit DET applies a signal to the control circuit AGC, as a result of which the gain factor of the signal amplifier AMP1 is reduced. The amplitude of the signal PS is reduced from a maximum value. If during the decrease of the gain of the signal amplifier AMP1 from 32 dB to 0 dB the nominal amplitude in the signal PS is reached then the amplitude reduction is stopped. From FIG. 2 it can be seen that the connected cable CC4 must then have a cable loss CCL of more than 20 dB. If the cable loss CCL is less than 20 dB, then during the AGC stepping down operation the value 0 dB is reached. The signal attenuator ATT is changed-over from 0 dB to 20 dB through the change-over circuits ATS in response to which the gain factor of the signal amplifier AMP1 increases as rapidly as possible to 20 dB. This is again followed by an AGC decrease until the nominal amplitude in the signal PS is reached.

In addition to the fact that from the moment the system is made operative the gain factor of the signal amplifier AMP1 having the automatic gain control AGC changes, the signal attenuator ATT is switched or not switched from 0 dB to 20 dB, the time signal generator TSG is also activated. After the system has been made operative, the time signal generator TSG applies with a delay of, for example, several dozen seconds a locking signal to the locking input LT of the change-over circuit ATS. After the instant the locking signal is applied to the locking input LT, the signal attenuator ATT is no longer capable of changing. After the locking instant the signal processing circuit is ready for normal signal processing. The signal amplifier AMP1 having the automatic gain control AGC is active in a normal manner to compensate signal variations due to temperature fluctuations in the system. If the signal attenuator ATT were not locked, then during normal signal processing a change-over might occur due to temperature fluctuations. Because of the inertia inherent to the automatic gain control AGC the change-over action of the attenuator would not remain without effect for the signal processing. Locking the signal attenuator ATT after the waiting period from the moment the system has become operative prevents the change-over which would be impermissible during normal signal processing from occurring as the change-over would be accompanied by sudden signal amplitude changes.

At the graphs shown in FIG. 2 arrow tips designate a hysteresis effect during the change-over of the switchable signal attenuator ATT. When during a cable loss measurement a decreasing value is measured, the signal attenuator ATT is changed-over at 20 dB, and when an increasing value is measured the signal attenuator is changed-over at 23 dB. Associated therewith is a sudden increase in the AGC control from 0 to 20 dB or from 23 dB to 3 dB, respectively. In known manner, the hysteresis effect prevents a repeated change-over from occurring. If the hysteresis effects obtained in the detection circuit DET through the control input HT is not utilized, a repeated change-over might occur during the waiting period for the locking operation at the signal attenuator ATT. The instantaneous position at the locking instant determines the ultimate position of the signal attenuator ATT. The utilization of the hysteresis effect prevents the repeated change-over during the locking waiting period from occurring and a non-recurrent change-over may occur. In the graph of FIG. 2 two crosses indicate two critical places at which the non-recurrent change-over may occur. The AGC control then suddenly changes from approximately 23 dB to approximately 3 dB or from approximately 0 dB to approximately 20 dB, respectively.

The graph of FIG. 2 is associated with a signal attenuator ATT which is switchable between 0 and 20 dB, the signal amplifier AMP1 having an AGC control between 0 and 32 dB and the signal amplifier AMP 2 having a gain factor of 20 dB. The attenuator ATT and the amplifiers AMP2 and AMP1 form an amplifier series arrangement (ATT, AMP2, AMP1) having a gain factor which is controllable between 0 and 52 dB. In the amplifier series arrangement (ATT, AMP2, AMP1) the controllable signal amplifier AMP1 is the major noise source with a signal-to-noise ratio which depends to an increasing extent on the input signal level and varies over the gain range from, for example, 60 dB to 80 dB. The signal attenuator ATT, which is a passive component is substantially noise free. The fixed signal amplifier AMP2 is a low-noise amplifier having a noise level of approximately 2 dB $\mu$V. The sequence in the amplifier series arrangement (ATT, AMP2, AMP1) is given in FIG. 1 as an optimum example, but they may be mutually interchanged.

If the hysteresis effect is omitted and it is desired to employ a controllable signal amplifier AMP1 which has the smallest possible control range, a signal amplifier AMP1 having an AGC control between 0 and 26 dB may be used for a maximum cable loss C=52 dB, with a two-position signal attenuator ATT. The fixed gain factor of the signal amplifier AMP2 is equal to 26 dB and the signal attenuator ATT is switchable between 0 and 26 dB. The signal amplifier AMP1 then has its maximum control range and the gain factor of the signal amplifier AMP2 and the change-over at the signal attenuator ATT are at their maximum. If a hysteresis effect of, for example, 3 dB is desired this can be accomplished by using a signal attenuator ATT which is switchable between 0 and 24.5 dB in combination with a signal amplifier AMP2 with a fixed gain factor equal to 24.5 dB and signal amplifier AMP1 with a AGC control between 0 and 27.5 dB or more. As is shown in the graph of FIG. 2, the change-over feature at the signal attenuator ATT is reduced from a maximum of 26 dB to 20 dB, with which an equal gain factor of the signal amplifier AMP2 is associated. The control range of the signal amplifier AMP1 is increased to the same extent by 6 dB to 32 dB. The sum of 20 and 32 dB has to be equal to the maximum possible cable loss of C=52 dB.

Generally, when a switchable signal attenuator ATT having n=2, 3, 4 etc. positions is used in a system having a cable loss of not more than C dB, there are n attenuation factors in a sequence of attenuation factors which are not more than the values (n−1)/n C dB, (n−2)/n C dB and (n−3)/n C dB to (n−n)/n C dB, inclusive the last of which is substantially equal to zero. The non-controlled signal amplifier AMP 2 has a fixed gain factor not more than (n−1)/n C dB and the signal amplifier AMP1 has a control range from 0 dB to at least (1/n) C dB. A hysteresis effect can be obtained by having the fixed gain factor and the attenuation factors deviate approximately one to some dB from the values. It will be apparent that the graph of FIG. 2 is associated with n=2, the 6 dB deviation from the 20 dB attenuation factor relative to the calculated value of 26 dB being equal to the increase of the AGC control range from 0 to 26 dB to 0 to 32 dB. In practice it has been found that this simplest construction wherein n=2 is very useful.

Figure 3:
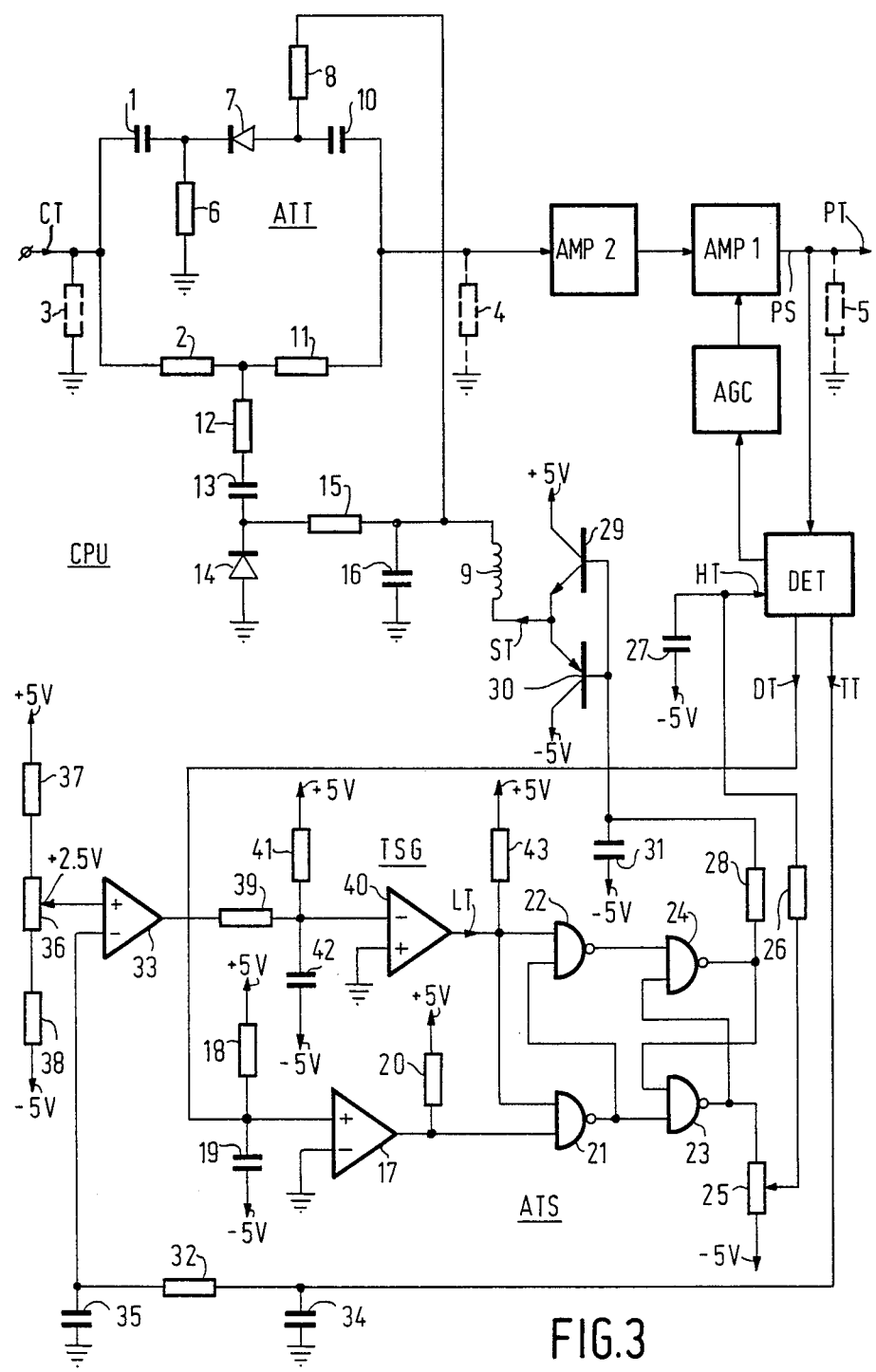
FIG. 3 shows in greater detail a circuit diagram of a portion of the system of FIG. 1.

FIG. 3 shows a more detailed circuit diagram of the switchable signal attenuator ATT, the change-over circuit ATS and the time signal generator TSG. Components which were already included in the signal processing unit CPU shown in FIG. 1 have been given the same reference numerals. In FIG. 3, the input CT of the signal attenuator ATT is connected to a capacitor 1, a resistor 2 and a terminating resistor 3 which is shown by means of dotted lines and has typically a resistance value of, for example, 75 ohm. Further terminating resistors 4 and 5 are shown in like manner at the input of the signal amplifier AMP2 and at the output of the signal amplifier AMP1, respectively. A further terminal of the capacitor 1 is connected to ground through a resistor 6 and to the cathode of a diode 7. The anode of the diode 7 is connected to the input ST through a series arrangement of a resistor 8 and a coil 9 and through a capacitor 10 to the input of the signal amplifier AMP2, which is further connected to the resistor 2 through a resistor 11. The junction of the resistors 2 and 11 is connected to ground through a series arrangement of a resistor 12, a capacitor 13 and a diode 14. The junction of the capacitor 13 and the cathode of the diode 14 is connected through a resistor 15 to the coil 9, which is further connected to ground through a capacitor 16. When a positive voltage of, for example, +4.3 V is applied to the change-over input ST, the diode 7 conducts and the diode 14 is non-conducting. The input CT is then coupled to the input of the signal amplifier AMP2 through the capacitor 1, the conducting diode 7 and the capacitor 10 resulting in a minimal attenuation of substantially 0 dB. When, however, a negative voltage of, for example, −4.3 V is applied to the change-over input ST the diode 7 is non-conducting and the diode 14 conducts. Then the output CT is coupled to the input of the signal amplifier AMP2 through the resistors 2, 11 and 12. The signal attenuator ATT conveys the input signal after having attenuated it by an attenuation factor of, for example, 20 dB. In the signal attenuator ATT the capacitor 16 and coil 9 produce a high frequency decoupling of the input CT from the input ST and also a time delay during the change-over action. The capacitor 13 is provided for direct current blocking purposes.

In FIG. 3 the measuring signal input DT of the change-over circuit ATS is connected to the (+) input of a differential amplifier 17 included therein. The (+) input of differential amplifier 17 is connected through a resistor 18 and a capacitor 19, respectively to a voltage terminal which carries a voltage of, for example, +5 V or −5 V respectively. These voltages are supplied by a d.c. voltage source, not shown, which is assumed to have a further terminal connected to ground. The (−) input of differential amplifier 17 is connected to ground and its output is connected through a resistor 20 to a voltage terminal carrying a voltage of +5 V, which output is further connected to an input of a NAND-gate 21. The output of the gate 21 is connected to an input of NAND-gates 22 and 23, respectively. The output of the gate 22 is connected to an input of a NAND-gate 24, to a further input of which the output of the gate 23 is connected. An input of the gate 23 is connected to the output of the gate 24 and its output is connected through a potentiometer 25 to a voltage terminal which carries a voltage of −5 V. A tap of the potentiometer 25 is connected through a resistor 26 to the control input HT of the detection circuit DET, which is further connected for high-frequency decoupling through a capacitor 27 to a voltage terminal carrying a voltage of −5 V. The output of the gate 24 is connected through a resistor 28 to the base electrode of two transistors 29 and 30 which are connected through a high-frequency decoupling capacitor 31 to a voltage terminal carrying a voltage of −5 V. The emitter electrodes of the npn-transistor 29 and the pnp-transistor 30 are connected to the coil 9. The collector electrode of the transistor 29 or 30, respectively, is connected to a voltage terminal carrying a voltage of +5 V or −5 V, respectively. In a manner to be described a voltage of +5 V or −5 V is present on the base electrodes of the transistors 29 and 30. The transistor 29 or 30, respectively are conductive so that in the event of a base-emitter voltage drop of 0.7 V a voltage of +4.3 V or −4.3 V is present at the change-over input ST of the signal attenuator ATT.

In FIG. 3 the measuring signal input TT of the time signal generator TSG is connected through a resistor 32 to the (−) input of a differential amplifier 33. The two terminals of the resistor 32 are connected to ground through high-frequency decoupling capacitors 34 and 35. The (+) input of the differential amplifier 33 is connected to a tap of a potentiometer 36. A terminal of the potentiometer 36 is connected through a resistor 37 or 38, respectively to a voltage terminal carrying a voltage of +5 V or −5 V, respectively. Near the tap of the potentiometer 36 it is shown by way of example, that it is adjusted for supplying a voltage of approximately +2.5 V. The output of the differential amplifier 33 is connected through a resistor 39 to the (−) input of a differential amplifier 40, which is further connected through a resistor 41 and a capacitor 42, respectively to a voltage terminal carrying a voltage of +5 V or −5 V, respectively. The (+) input of the differential amplifier 40 is connected to ground. The output of the differential amplifier 40 forms the output of the time signal generator TSG which is connected to the locking input LT of the change-over circuit ATS. The output of the differential amplifier 40 is connected to the inputs of the gates 21 and 22 and is further connected through a resistor 43 to a voltage terminal carrying a voltage of +5 V.

The following explains the operation of the circuit diagram shown in FIG. 3. To begin, the situation is as described with reference to FIG. 1, where no cable of the cable system CC is connected or the signal source CAM is in the switched-off state, as the case may be when a connecting cable is connected. There is no output signal on the output PT and the detection circuit DET applies a negative voltage of, for example, −5 V to the input DT of the change-over circuit ATS and a positive voltage greater than, for example, +2.5 V to the input TT of the time signal generator TSG. The detection circuit DET applies a voltage of a value to the circuit AGC that the signal amplifier AMP1 has the maximum gain factor of 32 dB.

Starting from the above example, a voltage of +2.5 V being present on the tap of the potentiometer 36, the higher positive voltage at the (−) input of the differential amplifier 33 results in the output supplying a negative voltage of, for example, −5 V the resistor 41 has a much higher value than the resistor 39, as a result of which the voltage division across the resistors 41 and 39 produces a negative voltage at the (−) input of the differential amplifier 40. The differential amplifier 40 then produces a positive voltage of, for example +5 V. The assumed negative voltage of the input DT results in the output of the differential amplifier 17 supplying a negative voltage of, for example, −5 V. Let it be assumed that the positive voltage of +5 V at the gates 21, 22, 23 and 24 corresponds to the logic 1 and the negative voltage of −5 V corresponds to a logic 0. The logic 0 received from the differential amplifier 17 causes according to the logic NAND-relation 0.0=0.1=1 and 1.1=0 the gate 21 to produce a logic 1. The gate 22, when the logic 1 from both the differential amplifier 40 and the gate 21 is applied to it, applies the logic 0 to the gate 24 which supplies the logic 1 in response thereto. In response to the logic 1 applied to its two inputs the gate 23 supplies the logic 0. This results in a negative voltage of, for example, −5 V occurring at the output of the gate 23 and a positive voltage of, for example, +5 V occurring at the output of the gate 24. The transistor 29 is then conductive and the transistor 30 is non-conducting, so that the positive voltage of, for example, +4.3 V is present at the change-over input ST. The diode 7 is conductive, so that the signal attenuator ATT is in the non-attenuating position of 0 dB.

Connecting a cable from the cable system CC or making the signal source CAM operative when a cable is connected results in a signal detection at the detection circuit DET. The voltage at the input TT of the time signal generator TSG then decreases to below the voltage of +2.5 V, which value is shown by way of example at the potentiometer 36. In response thereto the voltage at the output of the differential amplifier 33 changes from the assumed −5 V at a low output impedance to, for example, +5 V at a high output impedance. Thereafter charging the substantially uncharged capacitor 42 by a current which predominantly flows through the resistor 41 is then initiated. The resistor 41 and the capacitor 42 form an integrating circuit. If it is assumed that a resistor 41 having a value of 1MΩ and a capacitor 42 having a value of 33 μF. are used, a time constant of 33 s is obtained for the integrating circuit. A voltage change from approximately −5 to the ground potential of 0 V occurs at the (−) input of the differential amplifier 40. This voltage change to 0 V takes several dozen seconds. During this period of time the voltage at the output of the differential amplifier 40 does not change, so that it continues to supply the logic 1. The described period of time may be considered as a waiting period or a time delay before the time signal generator TSG starts applying, after signal detection, the logic 0 to the locking input LT of the change-over circuit ATS.

After signal detection by the detection circuit DET the gain factor of the signal amplifier AMP1 is stepped down from the maximum value of 32 dB. The voltage at the input DT then changes from the assumed −5 V to a less negative value. The stepping down operation of the gain factor of the signal amplifier AMP1 through the AGC circuit continues until the nominal amplitude of signal PS occurs, or continues until 0 dB. If during this stepping down operation during the waiting period the nominal amplitude in the signal PS is reached, the signal amplifier AMP1 retains the gain factor associated therewith. A negative voltage is then still present at the input DT of the change-over circuit ATS so that the differential amplifier 17 continues to apply the logic 0 to the gate 21. At the end of the waiting period the output signal of the differential amplifier 40 changes state, in response to which the logic 0 is applied to the gates 21 and 22 instead of the logic 1. The gate 21 continues to supply the logic 1 while the gate 22 changes state and commences supplying the logic 1 which however, does not affect the gate 24. It will be apparent that the gate 24 continues to supply the logic 1 so that the signal attenuator ATT remains in the position in which it produces a 0 dB attenuation factor.

If, however, during the described stepping down operation of the gain factor of 32 dB the nominal amplitude is not reached in the signal PS during the waiting period then the stepping down operation continues until 0 dB. The voltage at the output of the detection circuit DET connected to the input DT of the change-over circuit ATS then passes the 0 V ground potential. In response thereto the output signal of the differential amplifier 17 changes state and the logic 1 is applied to the gate 21 instead of the logic 0. The logic 1 is now applied to both inputs of the gate 21, so that it changes state and supplies the logic 0. In response thereto the gates 22 and 23 both change state and supply the logic 1. In response thereto the gate 24 changes state and supplies the logic 0. This results in the gate 24 and 23, respectively supplying a voltage having a value of −5 V and +5 V respectively. Through the resistor 28, the −5 V voltage at the output of the gate 24 results in the transistor 29 being blocked and the transistor 30 becoming conductive. The resultant voltage of −4.3 V at the change-over input ST of the signal attenuator ATT then results in the diode 7 being blocked and diode 14 becoming conductive. The signal attenuator ATT changes state so that the attenuation factor changes from 0 dB to 20 dB. Thereafter the gain factor of the signal amplifier AMP 1 is stepped up as fast as possible from 0 dB to a maximum of 20 dB. Thereafter the gain factor of the signal amplifier AMP1 is stepped down from the value reached. This stepping down operation now continues in the waiting period until the nominal amplitude in the signal PS is reached and the gain factor of the signal amplifier AMP 1 retains the value appropriate thereto. At the end of the waiting period the output signal of the differential amplifier 40 changes state and the logic 0 is applied to the gates 21 and 22 instead of the logic 1. The gate 21 then changes state and supplies the logic 1, while the gates 22, 23 and 24 remain unchanged.

In both these described cases the time signal generator TSG supplies the logic 0 instead of the logic 1 after a time delay of several dozen seconds. If in this situation a logic 0 or 1, respectively is present on the input of the gate 21, which input is connected to the differential amplifier 17, the gates 24 and 23 supplying the logic 1 and 0 or the logic 0 and 1, respectively gates 24 and 23 maintain their state independent of a possible subsequent change of state of the differential amplifier 17. The time signal generator TSG locks the gates 24 and 23 after the waiting period which corresponds to the time delay which has elapsed.

With reference to the graph of FIG. 2 a hysteresis effect at the change-over of the signal attenuator ATT has been described. If no use is made of a hysteresis effect a repeated change-over between 0 and 20 dB may occur in the signal attenuator ATT with a given critical cable length, the gain factor of the signal amplifier AMP 1 then varying between 20 and 0 dB. Temperature fluctuations in the connected cable of the cable system CC and at signal thresholds present may result in such a repeated change-over. In the described system repeated change-over can only occur in the waiting period before locking of the signal attenuator ATT. The logic 0 or 1 present at the locking instant at the output of the differential amplifier 17 determines, when the cable length is critical whether the signal attenuator ATT is given the attenuation factor of 0 or 20 dB.

The repeated change-over of the signal attenuator ATT and of the gain factor of the signal amplifier AMP1 may result in unwanted oscillations. To prevent these unwanted oscillations from occurring the hysteresis effect described with reference to FIGS. 1 and 2 may be employed, where a change-over action is followed by one single switch-back operation. In the circuit diagram of FIG. 3, the tap of the potentiometer 25 is connected for that purpose to the control input HT of the detection circuit DET. In the foregoing when the signal attenuator ATT is in the 0 dB position the gate 23 supplies the logic 0 which corresponds to −5 V voltage, whereas this gate 23 supplies the logic 1 which corresponds to a +5 V voltage when the signal attenuator is in the 20 dB position. The tap of the potentiometer 25 will then carry a voltage of −5 V, or a less negative to positive voltage, respectively depending on the position of the moving contact of the potentiometer. This results in a different current being applied to the control input HT through the resistor 26 as a result of which the 0 V ground potential is present at the input DT of the change-over circuit ATS at a higher value in the signal PS. By way of example a 3 dB higher signal value is shown in the graph of FIG. 2. The desired extent of the hysteresis effect can be adjusted by means of the potentiometer 25. The hysteresis effected described can be obtained by using commercially available integrated circuits, such as the Philips Circuit TDA 2540. The signal amplifier AMP1, the AGC circuit and the detection circuit DET of FIGS. 1 and 3 are in the integrated circuit. In the specifications relating to this integrated circuit inputs and outputs are provided with reference numerals. Thus, there are two inputs having the reference numerals 1 and 16, which correspond to the single input of the signal amplifier AMP1, which input is shown in FIGS. 1 and 3. An input having the reference numeral 3 corresponds to the control input HT, an output having the reference numeral 4 and 14, respectively corresponding to the output DT and TT, respectively of FIGS. 1 and 3. An output having the reference numeral 12 corresponds to the output PT of FIGS. 1 and 3. In the event that the signal-to-noise ratio of the integrated circuit is considered to be insufficient for signal processing in the unit CPU a first signal amplifier, not shown, having an automatic gain control, with an increased signal-to-noise ratio may be connected to the output of the signal amplifier AMP2. The signal PS shown in FIGS. 1 and 3 can then, for example, be used for the sole purpose of locking the signal attenuator ATT in the 0 dB or the 20 dB position. At the potentiometer 36 the value of +2.5 V is shown such as it has been found to occur in practice when the integrated circuit is used in the signal processing system in accordance with the invention. For the same reason the resistors 18, 26 and 32 and the capacitors 19, 27, 34 and 35 are shown in FIG. 3.

Thus, there has been described with respect to one embodiment, a signal processing system according to the invention. Those skilled in the art will recognize yet other embodiments described more particularly by the claims which follow.

What is claimed is:

1. A signal processing system which provides a substantially constant amplitude signal transmitted over a connecting cable selected from a plurality of connecting cables of different lengths of different losses, comprising:
    a series signal processing circuit which receives a signal from said selected cable which includes:
    a signal amplifier having automatic gain control,
    a low noise signal amplifier having a fixed gain,
    a switchable signal attenuator having a changeover input which selects and locks a different attenuation level in response to an applied signal
    a timing signal generator for generating a delay signal in response to an input signal;
    a signal detector connected to receive an output signal from said series circuit, and to supply an input signal to said timing signal generator; and
    a changeover circuit connected to receive a signal from said signal detector and said timing signal generator, said changeover circuit connected to said switchable signal attenuator changeover input, said series signal processing circuit providing a controlled amplitude signal when a selected attenuation level is locked by said delay signal after a time delay generated by said timing signal generator.

2. The signal processing circuit of claim 1 wherein the gain of said signal amplifier having automatic gain control is controlled by said signal detector.

3. The signal processing circuit of claim 1 further comprising a hysteresis control means for switching over said attenuator at a different detected signal level during the detection of a decreasing signal provided by said series signal processing circuit than for an increasing signal level.

4. A signal processing system as claimed in claim 1, wherein said time delay signal for locking the signal attenuator has a duration of several dozen seconds.

5. A signal processing system as claimed in claim 1 or 4, wherein a maximum possible cable loss in the system is equal to C dB, and said switchable signal attenuator has a plurality of n attenuation positions, the control range of the signal amplifier having automatic gain control extending from zero to a value of at least $(1/n)$ C dB, the gain factor of the low-noise signal amplifier is not greater than the value of $(n-1)/n$ dB, and the switchable signal attenuator has n attenuation factors which sequentially are not greater than $(n-1)/n$ C dB, $(n-2)/n$ C dB, $(n-3)/n$ C dB, the last attenuation factor being substantially equal to zero.

* * * * *